United States Patent [19]
Ehrlich

[11] Patent Number: 5,874,011
[45] Date of Patent: Feb. 23, 1999

[54] LASER-INDUCED ETCHING OF MULTILAYER MATERIALS

[75] Inventor: Daniel Ehrlich, Lexington, Mass.

[73] Assignee: Revise, Inc., Burlington, Mass.

[21] Appl. No.: 691,147

[22] Filed: Aug. 1, 1996

[51] Int. Cl.[6] .................................................. C23F 1/00
[52] U.S. Cl. .............................. 216/65; 216/72; 216/75; 216/74
[58] Field of Search ................. 216/65, 63, 72, 216/75, 76, 77, 74; 29/603.01

[56] References Cited

U.S. PATENT DOCUMENTS

| | | | |
|---|---|---|---|
| 3,364,087 | 1/1968 | Solomon et al. ........................ | 156/4 |
| 4,260,649 | 4/1981 | Dension et al. ........................ | 427/53.1 |
| 4,340,617 | 7/1982 | Deutsch et al. ........................ | 427/53.1 |
| 4,359,485 | 11/1982 | Donnelly et al. ....................... | 427/53.1 |
| 4,622,095 | 11/1986 | Grobman et al. ....................... | 156/635 |
| 4,751,779 | 6/1988 | Nagatomo et al. ...................... | 29/603 |
| 4,752,668 | 6/1988 | Rosenfield et al. ..................... | 219/121 |
| 4,948,460 | 8/1990 | Sandaiji et al. ........................ | 156/630 |
| 5,310,624 | 5/1994 | Ehrlich ................................... | 430/322 |
| 5,389,196 | 2/1995 | Bloomstein et al. .................... | 156/643 |

OTHER PUBLICATIONS

Roger Wood, "*Magnetic megabits*", IEEE Spectrum, May 1990, pp. 32–33 and 36–38.

Hackh's Chemical Dictionary, definition for "permalloy," p. 502, 1969.

*Primary Examiner*—Marion McCamish
*Assistant Examiner*—Cheryl Juska
*Attorney, Agent, or Firm*—Thomas J. Engellenner; Lahive & Cockfield, LLP

[57] ABSTRACT

Techniques and apparatus for the laser induced etching of a reactive material, or of a multilayer substrate or wafer comprising layers of materials of different etching characteristics and reactivities, are disclosed. Short wavelength laser radiation and control of the process ambient equalize etch rates of the layers of a multilayer substrate or wafer and allow high-resolution etching. A suppressant gas introduced into a halogen-containing ambient suppresses explosive reactions between the ambient and reactive materials or layers. For less reactive layers or materials, reduced-pressure air is a suitable ambient. The techniques and apparatus disclosed herein are particularly useful in the manufacture of magnetic data transfer heads.

8 Claims, 4 Drawing Sheets

LASER-INDUCED ETCHING OF MULTILAYER MATERIALS

BACKGROUND OF THE INVENTION

This invention relates to methods and apparatus for laser induced etching of materials, especially structures composed of layers of materials with dissimilar reactivities and etching characteristics. In particular, the invention concerns methods and apparatus for manufacturing thin-film magnetic data transfer heads.

The benefits of increased information storage capacity of a recording medium are several and include lower cost, more powerful, lighter weight computers, and the development of more powerful computer application programs. The capacity of magnetic storage media such as hard disks and magnetic tapes is not principally limited by the medium, but by the geometry of the data transfer head used to read the data from, and write the data to, the disk or tape. The bit area is determined by the physical geometry of the data transfer head, which, in turn is limited by current methods of manufacturing the transfer head.

A magnetic recording medium, such as a hard disk or tape, typically comprises a backing medium covered by a thin film of ferromagnetic material. This film can be thought of as composed of a large number of individual magnetic dipoles, present in a uniform density, and initially randomly oriented. The data transfer head writes data onto the film by creating regions of aligned dipoles.

Information is stored on the film as a pattern of aligned dipoles. To record information, the information is converted to voltage pulses which are supplied to an energizing coil of the data transfer head. These voltage pulses cause a current in the coil, and a magnetic field in a magnetic gap of the head. Because the magnetic gap is placed in close proximity to the film, the dipoles in the film are aligned in one direction or the other, depending on the polarity of the applied voltage.

The performance of the head is determined most significantly by the gap geometry and the air-bearing surface, which jointly control the dimensions of a bit in the recording medium. Under well controlled close-coupling geometry the gap dimensions are limiting and, therefore, there is intense interest in producing smaller gaps with well defined geometry. However, the air bearing is also critically important since this surface determines the height of flying magnetic head above the recording medium. Excessive height or instability in this height will degrade the device performance. Therefore evolving designs incorporate increasingly complex air foil shapes.

The wet etching and reactive ion etching techniques currently used to fabricate data transfer heads have several disadvantages that limit their ability to form the smaller geometric structures necessary for future scaled devices. Other aspects of current methods limit low-cost mass production of these devices.

Current data transfer heads are typically formed from a wafer onto which films of various materials have been deposited. The wafer is thus a multilayer structure that includes layers of ceramic, i.e., metal oxides, such as alumina; metals, such as aluminum; metal nitrides; metal carbides; hard carbon films; permalloy; cobalt alloys; and nickel phosphorous compounds. Other metal and dielectric films may also be present. The magnetic gap and air foil must be precisely defined in these multilayer structures.

In practice the combined requirements on conventional etch process and on the mask layer necessitated by conventional etches can lead to an impossible or highly restricted processes. In an extreme recent development, some manufactures have been driven to use focused ion beam (FIB) technology to define the sensor gap. In this case a submicrometer diameter beam of ions (usually Gallium ions) is focused onto the substrate and used to ion sputter instead of chemically etch the head structure. Since only nanoamps of current are possible with FIB technology, this approach is very slow (typically removing cubic micrometers or less material per second). However no mask is needed and ion sputtering has the material insensitivity required to uniformly etch all the layers of the thin-film head without undercut.

Finally, the critical geometric structures and surface finish required can currently often only be obtained by a post-etching polishing of portions of the data transfer head. The data transfer heads are handled as individual units. That is, the wafer containing layers of metal and ceramic is diced into individual die, not as a final step in the manufacturing process, but rather as an intermediate step in the process. Each die is then extensively processed individually before it is a finished data transfer head. This individual handling of die increases considerably the time and cost of manufacturing. For example, one wafer can contain hundreds, or thousands, of die heads. Manufacturing of these individual die by current methods, requires individual handling and precise three-dimensional registration of each die for all precision patterning steps. In contrast a single precision alignment for the full wafer is required if the patterning can be done before dicing. It is this same economy that is currently driving manufacturers to ever increasing wafer size for manufacturing of silicon devices.

It is known in the art to microchemically etch thin-films and substrates using a laser. As a result of the anisotropy created by the beam, mask undercutting is minimal compared to other etch techniques. Typically, a laser beam is focused onto the material to be etched in the presence of a reactive ambient gas, liquid, or film. The laser causes a chemical reaction, localized to the area of the substrate illuminated by the laser, and results in the etching of the laser-illuminated area. The chemistry involved in the process of laser-induced microchemical etching can include photolysis (e.g., linear photochemistry) or thermal processes (e.g., thermal decomposition of the substrate, or gas pyrolysis). In photolysis, the laser energy interacts significantly with the ambient by direct absorption in the gas to form reaction products that etch the substrate. In the thermal methods, the laser heats the substrate to drive a reaction between the substrate material and the ambient. Laser pyrolytic and photolytic techniques can also be used to deposit films on substrates.

The development of laser microchemical processes for the etching of materials such as silicon is described in Ehrlich et al. (D. J. Ehrlich R. M. Osgood, and T. F. Deutsch, Applied Physics Letters 38, 1018–1020, (1981) and von Gutfield and Hodgson (R. J. von Gutfield and R. T. Hodgson, Applied Physics Letters 40, 352–354, (1982), herein incorporated by reference. These processes use vapor or liquid ambients in combination with an argon ion laser to achieve fast direct write etching of silicon and/or ceramics. Yokoyama et al. (S, Yokoyama, Y. Yamakage, and M. Hirose, Applied Physics Letters, 47, 389–391, (1985) and Gee and Hargis (SPIE proceedings 459, 132–137, (1984), also incorporated herein by reference, describe extensions of this technique using excimer lasers to etch silicon dioxide in the presence of reactive vapor ambients. General reviews of laser microchemical processing can be found in Ehrlich and Tsao (D. J.

Ehrlich and J. Y. Tsao, Laser Microfabrication, Pages 1–582, Academic Press, Boston (1989) and D. J. Ehrlich and J. Y. Tsao, J. Vac Sci. Technol. B-1, 969–984, (1983)). These references are likewise herein incorporated by reference.

Laser microchemical etching has not found extensive use in defining the critical geometric structures, such as the air-foil and the magnetic gap, of data transfer heads. The multilayer structure, or wafer, from which the data transfer head are fabricated contains layers of many different materials including alumina, metal nitrides, metal carbides, hard carbon coatings, permalloy, cobalt alloys, nickel phosphorous compounds, and other elemental metal films. These materials are not alike in their optical properties or thermal properties. The process parameters required to successfully etch these materials can be so different so as to make fabrication of the critical geometric structures of a data head difficult.

For example, problems often arise in laser-induced etching because of the presence of adjacent metal and metal oxide layers, especially when the metal is aluminum. Aluminum is highly reactive, but naturally forms a self-passivating oxide layer on its surface. Aluminum is actually instantaneously combustible in air; it is known as a practical, stable material because its oxide, which is formed during the instantaneous combustion, is one of the most stable and unreactive materials known. For example, when aluminum is machined on a milling machine, the freshly exposed aluminum metal undergoes spontaneous combustion or oxidation and is then converted into an impenetrable alumina or aluminum oxide layer, which quickly grows to the point where it is thick enough to extinguish further oxidation. Only a few atomic layers of the aluminum are consumed, and aluminum appears stable and passive in normal machining. However, this process of spontaneous combustion is not so benign when aluminum is laser etched. Laser etching requires a reactive, typically a halogen, ambient to convert laser-etched material into stable volatile effluent gases.

To laser etch a reactive, self-passivating metal such as aluminum, high laser powers are necessary to break through the oxide layer coating the aluminum. However, once the unoxidized metal is exposed, the laser-heated region reacts explosively with the halogen-containing ambient. The explosions crater the aluminum disastrously. As a result, critical geometric structures such as the magnetic gap cannot be successfully formed. Similar explosive effects can take place when laser etching is used on a multilayer structure containing a metal layer and a ceramic layer as, again, there are enormous differences in the laser reactivities of metals and ceramics.

One solution to this problem has been developed by Koren and co-workers (G. Koren, F. Ho, and J. J. Ritsko, Applied Physics Letters 46, 1006–1008 (1985); Applied Physics A40, 13–34), both herein incorporated by reference. Koren used a pulsed laser with a pulse duration of only twenty nanoseconds to laser etch aluminum in an ambient containing low- pressure chlorine gas. The short pulse duration limits the heating of the aluminum such that etching does occur, but the aluminum is not heated enough to create a sustained explosion of the aluminum in the halogen ambient. This techniques works, but it is extremely slow, due the short pulse duration, low pulse repetition frequency, and low halogen pressure. It is not suitable as a low cost, high production manufacturing method of forming the critical geometric structures, such as the magnetic gap and the air bearing, of magnetic data transfer heads.

There exists a need for improved techniques for efficiently forming the critical geometric structures that are part of a data transfer head. Such techniques would allow the formation of smaller geometric structures which are required to increase the data storage capacity of magnetic media at a reasonable cost.

Accordingly, an object of the invention is to provide a new technique for forming the critical geometric structures, such as the magnetic gap of data transfer heads.

Another object of the invention is to provide more economical and faster techniques for forming smaller magnetic gaps, thus reducing the cost of increased data storage capacity in magnetic media.

Another object of the present invention is to provide a method and apparatus for reducing the time and cost involved in the manufacture of data transfer heads.

Yet another object of the invention is to reduce the handling of individual die elements in the manufacture of magnetic data transfer heads.

A further object of the present invention is to reduce the process steps and number of mask layers required to manufacture a data transfer head, and to allow the use of simple, easily removable masking materials.

Yet a further object of the invention is to provide a technique for forming the precise geometric structures of data transfer heads using continuous-wave laser etching.

An additional object of the invention is to provide a technique of laser etching that allows reactive metals, and, in a multilayer structure, adjacent layers of metals and ceramics, to be microchemically laser etched without cratering.

Another object of the present invention is also to provide a laser etching technique for forming the air-bearing structure of a magnetic data transfer head.

SUMMARY OF THE INVENTION

Methods and apparatus are disclosed for improved laser-induced etching of materials. The invention achieves such improvements by introduction of a controlled process ambient along with appropriate selection of the wavelength of the laser radiation within a specific window region of material spectra, thereby achieving qualitatively improved control of the etching characteristics of the various layers in the multilayer structure of a data transfer head. The ambient may be a mixed reactive halogen ambient and/or reduced pressure air in combination with a suppressant vapor.

In one aspect of the invention, control of the ambient involves introducing a suppressant gas into a reactive halogen-containing ambient to allow high resolution microchemical laser etching of reactive, self-passivating metals and of adjacent ceramic or metal layers. The suppressant gas moderates the reaction between the halogen ambient and the substrate to eliminate explosive, uncontrolled reactions.

According to another aspect of the invention, control of the ambient involves controlling the chamber to a pressure of air less than atmospheric pressure. Reducing the ambient pressure inhibits the formation of a back pressure. Back pressure and shock waves from the atmospheric-pressure ambient cause the vaporized or ejected material to redeposit in an uncontrolled fashion on the wafer or substrate being etched.

Another important feature of the present invention is the selection of the wavelength of laser radiation. At most commonly used laser wavelengths, the optical properties of the substrate materials used in data transfer heads are so different so as to render it difficult or impossible to transfer accurate patterns through the full thickness of the multilayer device. One part of this difficulty is that the process parameters for laser etching these materials with high resolution vary widely from one material to the next. Laser-thermal processes can be highly nonlinear, and the multilayer structure of a data transfer head comprises many different materials. Process parameters, such as laser fluence, wavelength, pulse duration, and concentration of ambient gases required for etching one layer may result in uncontrolled, destructive etching of an adjacent layer. We have found that the best choice of wavelength is just beyond the long-wavelength electronic absorption edge of the least absorbing layer. This bounds the laser process window in the long-wavelength direction. In our experiments we have found that the optimal laser wavelength is further bound by excess absorption in the halogen vapor, which bounds the optimal wavelength at short wavelength. However, in a specific process window, referred to herein as near-ultraviolet (near-UV) wavelengths and comprising those wavelengths in the range from approximately 550 nanometers to 190 nanometers, the optical properties of many of the materials become very similar and optical transparency through halogen vapors is retained. Thus, the use of laser radiation in this optical window, combined with careful selection of the ambient allow successful laser microchemical etching of the critical geometric structures of multilayer data-transfer heads.

According to another aspect of the invention, an undiced wafer or substrate is housed in a chamber. A translatable fixture in the chamber supports the wafer and allows movement of the substrate relative to a beam of laser radiation. A source of near-UV radiation, typically emitting radiation at a wavelength between 550 and 190 nm, is provided. The radiation enters the chamber via an optical window. Sources of suppressant gas and halogen gases are connected for controlled introduction of these gases into the ambient, and a vacuum pump allows evacuation of the chamber. The suppressant gas controls the reactive processes between the ambient and the substrate material.

The invention can further including patterning means via selectively illuminating the substrate with the radiation so as to selectively microchemically etch the substrate. The patterning means for selectively illuminating can comprise, for example, a contact mask disposed adjacent to the wafer in the chamber. Alternatively, the patterning means for selectively illuminating can comprise optical assemblies for focusing the beam of laser radiation to a small spot and scanning the spot over the wafer to etch only those areas of the wafer scanned.

According to yet another feature of the invention, the means for selectively illuminating can comprise a photo mask. This photo mask is used much like projection-printing in ordinary photolithography. The mask is disposed at some distance from the wafer, typically outside the chamber. Appropriate optics can be used to illuminate the mask with radiation and then refocus the image of the mask, typically reduced, onto the wafer. Exposed areas of the wafer are thus etched. A step and repeat process is typically used to pattern the whole wafer. This step and repeat technique is well known in the art.

According to another aspect of the present invention, gas jets positioned adjacent to the area of the wafer being laser etched provide the ambient, including the halogen gas, and, if used, the suppressant gas. In this aspect, the invention may not use a chamber or an optical window. The use of such gas jets together with a vacuum source permits the entrainment and removal of etch products.

The term "multilayer structure," as used herein, refers to a substrate or wafer that contains one or more layers of material, typically deposited as a film, that are used as part of a data-transfer head. Such a head will have several layers of metal, ceramic, and the other materials such as aluminum, metal nitrides, metal carbides, hard carbon coatings, permalloy, cobalt alloys and nickel phosphorus compounds. The term "reactive, self passivating metal," as used herein and frequently employed in head manufacture, refers to metals that, in certain environments, are highly reactive, but self-quench reactive processes by the formation on their surface of a thin layer, typically an oxide. Such metals include, but are not limited to, aluminum and titanium, as well as alloys of aluminum and alloys of titanium. Note that a reactive self-passivating metal film can be considered a multilayer structure as the self-passivating layer is a metal oxide that differs significantly in its etching properties from the elemental metal underneath. "Reactive, self-passivating metals" form a class of special-problem materials in head manufacture.

invention allows the use of continuous wave (CW) laser radiation, speeding the etching process considerably, such that the invention provides a viable method for the manufacture of the critical structures of data-transfer heads with CW radiation. Pulsed laser radiation may also be used, typically at higher pulse intensities and longer pulses than could be used with prior art techniques.

The present invention permits critical geometric structures, such as the magnetic gap, to be formed substantially before the wafer is diced into individual die. The need for multiple, chemically resistant, and difficult-to-remove masking layers is greatly reduced. The principal requirement of a mask is that it have good optical reflectivity at the wavelength of laser radiation used to micro-chemically etch the layer of the wafer currently being processed. Mask erosion and undercutting of the mask are greatly reduced, and deep vertical rectangular structures are more readily created. Choice of the proper ambient and the wavelength of the laser radiation provide a laser microchemical etching technique more suitable to low cost production of high capacity data storage devices than other currently used techniques. Individual handling of each die is greatly reduced.

The invention is also a method for fabricating the critical geometric structures of a data transfer head such as the magnetic gap and the air bearing, as well as a method for laser etching a substrate in a halogen-containing ambient by employing a suppressant gas to control reactive processes between the substrate material and the ambient. The above methods are practiced in accordance with the embodiments disclosed herein.

BRIEF DESCRIPTION OF THE DRAWINGS

For a more complete understanding of the features, advantages, and objects of the invention reference should be made to the following detailed description and the accompanying drawings, in which like numerals are used to indicate like components of the apparatus illustrated, and in which;

FIGS. 2A–2C are illustrations of typical problems encountered in prior art laser etching techniques for thin-film heads.

FIGS. 3A–3C illustrate another prior art problem in laser etching of reactive metals; in FIG. 3B the etching beyond the surface layer and an explosive reaction is illustrated; while

FIGS. 4A–4C are illustrations of the advantage of using the suppressant gases according to the present invention in a laser etching process.

FIGS. 8A–8C illustrate tree techniques for selectively illuminating a substrate with laser radiation.

DETAILED DESCRIPTION

Figure 1:
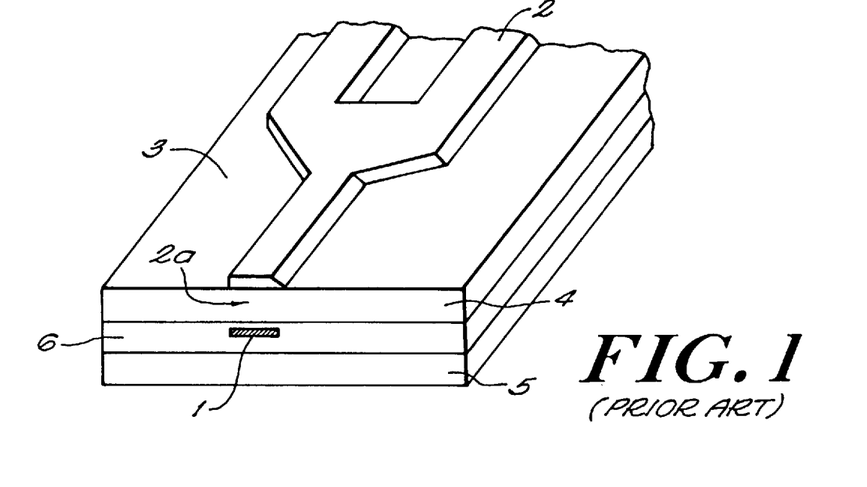
FIG. 1 is a schematic perspective view of a typical prior art thin-film magnetic structure, comprising a layered structure of metallic and ceramic materials.

FIG. 1 illustrates a typical thin-film magnetic structure. These devices are comprised of a layered structure of metallic materials 1,2 and ceramic materials 4,5,6 which must be micromachined with exacting geometry and surface finish. A particularly important aspect is the formation of two structures, namely, the magnetic gap 2a and the air bearing surface 3. The air bearing is an airfoil, usually formed by appropriately shaping surface 3 and metal layer 2, that causes the data transfer head to "fly" just above a moving data storage medium, such as a rotating hard drive. Typically, the air bearing can comprise grooves and/or ridges formed in surface 3 and metal layer 2. The magnetic gap 2a defines the magnetic performance for both reading and writing functions. This structure is rapidly shrinking in dimensions for advanced magnetic heads. The air bearing controls the aerodynamic properties of the devices as it glides at high speed over the magnetic storage material. It is also a precision structure since the thickness of the air cushion between the storage material and the head must be accurately maintained. A critical step for both structures is the etch step which defines their geometry.

Current methods for etching of magnetic heads typically involve photolithography combined with wet or dry (e.g., reactive ion induced) etching methods. These methods require development of suitable contact masking layers which can protect the surface in areas which are not to be etched. Mask materials are not trivial to develop and only partially successful since many of the materials, particularly the ceramics, used in magnetic devices are very inert and hence require very vigorous etchants. As a result only a limited depth can be etched before the mask layer itself is eroded by the etchant. The problem of finding suitable etch mask materials for conventional etches is greatly compounded by the multiple layers in the magnetic heads. A last design criteria for masking materials is that the mask layer should be removable (following etching) without doing damage to the device underneath. Facile stripping of the mask layer can be in direct contradiction to the chemical stability requirements cited above. Extreme process cleanliness is essential for both the etching and mask stripping steps. Many etch processes leave behind filaments or process debris.

Figure 2A:
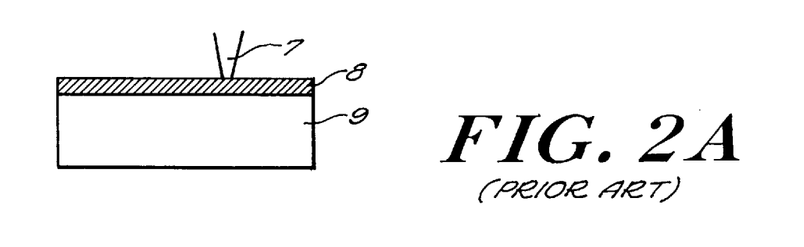
In FIG. 2A, an initial step of projecting a laser beam onto a substrate is shown.
Figure 2B:
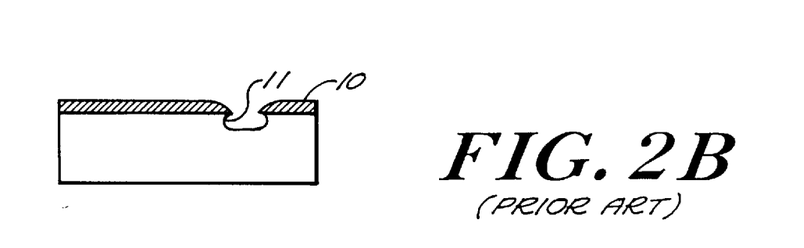
in FIG. 2B, the erosion of an underlying layer is illustrated and in FIG. 2C the resulting cavitation of the recess is shown.
Figure 2C:
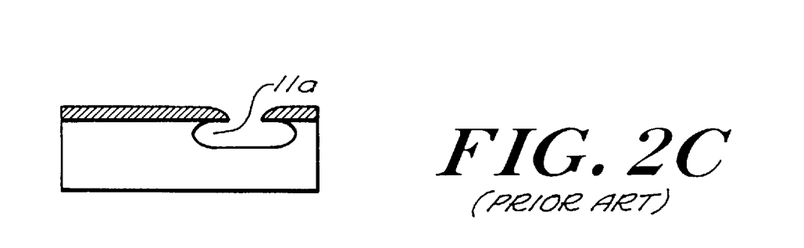
Figure 3A:
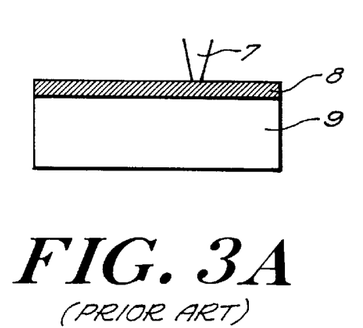
in FIG. 3A a laser beam is initially projected onto a substrate.
Figure 3B:
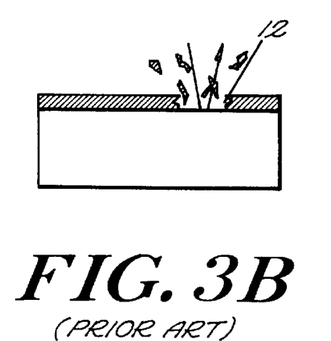
Figure 3C:
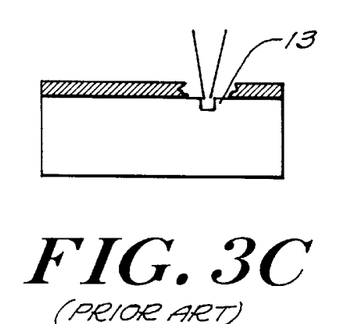
FIG. 3C illustrates the typical explosive traitor resulting from such processes.
Figure 4A:
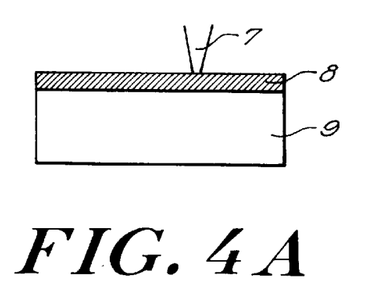
in FIG. 4A, a substrate is again exposed to laser radiation.
Figure 4B:
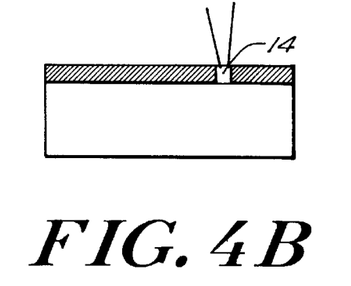
in FIG. 4B the upper layer of the substrate is etched away in the presence of the suppressant gas without cratering or explosion; and in FIG. 4C, the etching continues into the substrate body with well-defined vertical walls.
Figure 4C:
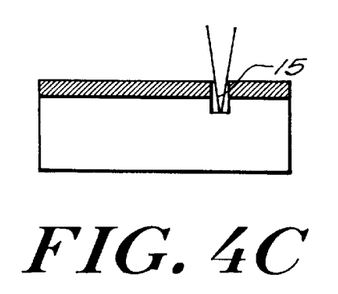

FIGS. 2A–2C illustrate the application to of laser etching as a means to pattern magnetic heads without photolithography. Several problems encountered in applying the method are also depicted. A laser beam 7 is projected onto a substrate comprising metal 8 and ceramic 9 thin film layers. All additional masking layers, like photoresist and etchmask materials are eliminated due to application of the process. Therefore the patterning is greatly simplified using the laser etching method. Nonetheless, two typical problems are still often encountered; namely erosion of layer 10 induced by the laser and "undercut" 11, i.e., cavitation under one of the thin film head layers. As indicated in FIG. 2A–2C, undercut and erosion destroy the verticality of the etch sidewall, and compromise the photolithographically defined dimensions. The problem of undercut becomes worse as a deeper recess is etched in the substrate, as indicated by 11a in FIG. 2C. It therefore leads to unacceptable device performance in most cases. A second problem encountered in laser etching is explosive destruction of the metal layer 12, as illustrated in FIGS. 3A–3C, which for metals such as aluminum and titanium, typically occurs at laser powers well below those required to initiate etching in ceramic layers 13. FIGS. 4A–4C illustrate the benefit of using a suppressant gas during laser etching. In this case excellent straight-wall pattern transfer can be obtained in both the metal 14 and the ceramic layer 15, without undercut, erosion or explosive etching of the metal.

Figures 5, 6:
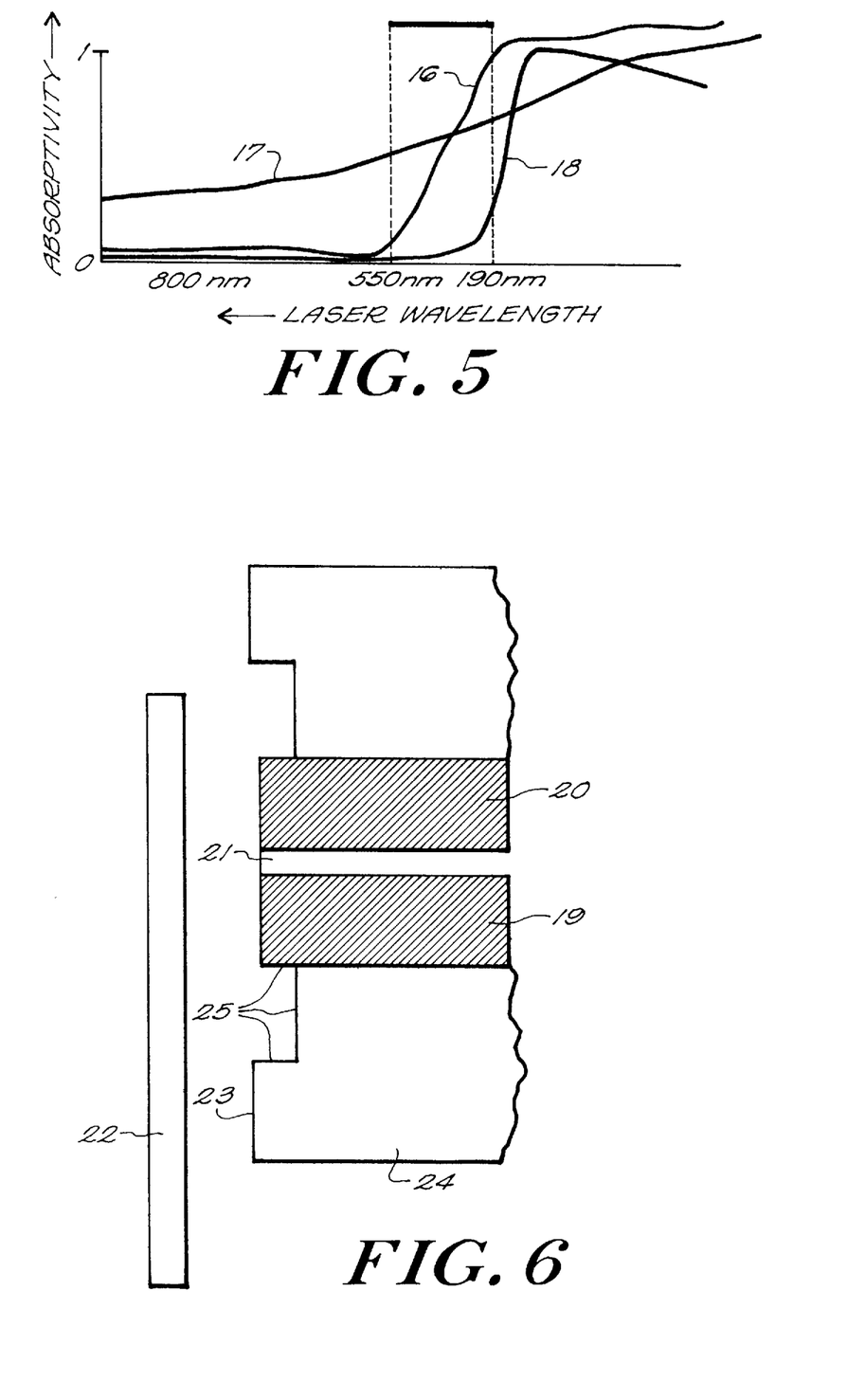
FIG. 5 is a graph illustrating spectral reflectivity versus laser wavelength for a metal masking layer and a ceramic substrate.
FIG. 6 is a schematic cross-sectional view of a type of data transfer head etched in accordance with the present invention.

FIG. 5 illustrates a further serious problem which results from large differences in the optical, as opposed to reactivity differences. In this figure, the typical absorptivity of metal 16 and ceramic 17 layers are shown. The large difference in absorptivity throughout most of the visible and infrared spectrum leads to excessive absorption in the ceramic layer. This further exacerbates explosive etching conditions. Furthermore, laser etching in the ultraviolet is severely constrained by unwanted gas-phase absorption 18, typical of most halogen-containing gases. These etch gases become strongly opaque throughout most of the ultraviolet. FIG. 5 illustrates a relatively narrow spectra range in which excellent laser etching can be achieved.

FIG. 6 illustrates another type of data transfer head. Metal layers 19 and 20 are spaced to form magnetic gap 21, which is disposed adjacent disk 22. Surface 23 of data transfer head is parallel to the top surface of substrate wafer 24. By the method of laser etching, the faces 25 are all formed as part of the laser-etch step of a vertical cavity in an undiced wafer.

As appreciated by those skilled in the art the techniques and apparatus disclosed herein do not preclude laser etching of individual die elements if such a procedure is found to be advantageous.

The apparatus and methods of the invention, such as suitable halogen ambients and laser fluences, are now be discussed in illustrating the three principal techniques for selectively illuminating the substrate. Process parameters generally suitable for many of the materials found in data transfer heads are given. Subsequently, illustrative examples are given of typical suppressant gasses, concentrations of those gasses and process parameters for etching self-passivating reactive metals or layers of ceramic and metal.

Figure 7:
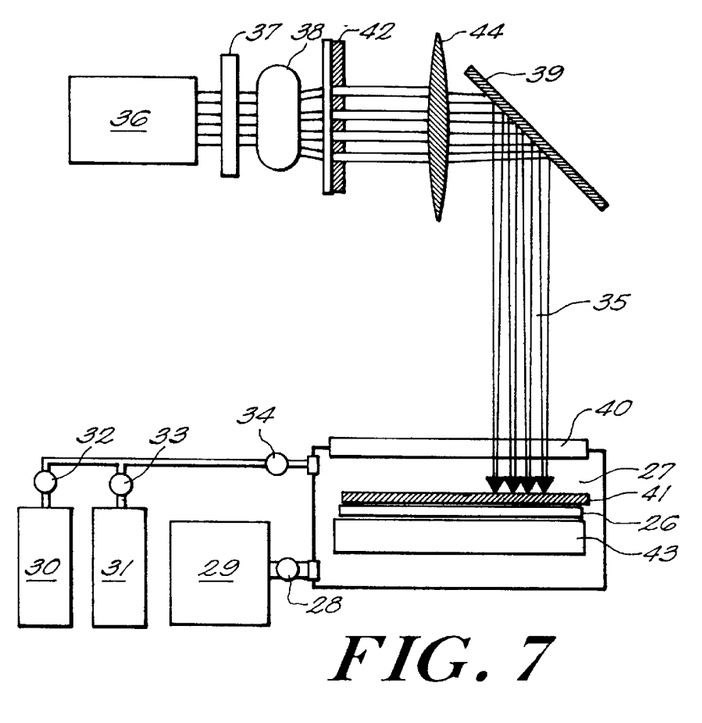
FIG. 7 depicts an apparatus used to perform laser etching of a wafer in accordance with the present invention.

FIG. 7 illustrates apparatus for laser etching a wafer or substrate and the use of a contact mask to selectively illuminate and hence selectively laser etch the wafer. Note that the terms "wafer," "substrate" and "multilayer structure" as used herein generally refer to a wafer onto which many layers of material typically used in data transfer heads have been deposited. However, the techniques and methods disclosed herein are not limited to the laser etching of multilayer wafers, and the invention encompasses laser etching of substrates composed of a single material such as a block of aluminum.

Substrate 26 is housed inside chamber 27. The chamber 27 can be evacuated through a valve 28 connected to a vacuum pump 29. The chamber 27 can also be back-filled with a selected gas from one of several reservoirs, of which reservoirs 30 and 31 are representative. Individual valves, such as valves 32,33 and 34, allow for control of the pressure of a given gas in the chamber 27. A laser beam 35 is generated with laser source 36. The beam may be conditioned using optics 38, further controlled by shutter mechanism 37, and may be deflected via electroptical or mechanical means 39. An optically transparent window 40 is formed in the side of chamber 27 to allow entry of the laser beam 35. Substrate 26 can be selectively illuminated by the beam through use of contact mask 41 which has been prepatterned as part of a prior procedure or by a projection mask 42. A projection lens 44 can be used in combination with mask 42 to image with or without a change in magnification. Wafer 26 is supported by fixture 43, which may also serve to translate the wafer by means of a motorized stage. The principal characteristic of masks 41 and 42 that is important for laser etching is its optical transparency ratio in open and closed regions of the masks. Metal films work well. A preferred metal is aluminum which can be electron beam evaporated onto the substrate and then patterned using photo resist and a conventional aluminum enchant such as phosphoric/nitric acid solution, or by a plasma etching technique, as is known by those of ordinary skill in the art. Aluminum contact masks ranging in thickness from about 0.1 micrometers to about 0.5 micrometers are suitable. After the aluminum is patterned the photoresist is stripped in a photo resist solvent or alternatively may be left intact. If the photo resist is not to be stripped, it is preferably deposited such that is a half wavelength thick at the wavelength of the laser, to enhance the reflectivity of the aluminum.

Gases in reservoirs 30 and 31 and vacuum pump 29 are used to selectively control the ambient. A preferred ambient for laser etching many of the less reactive materials found in the data transfer head, such as alumina, metal nitrides and metal carbides, is reduced pressure air, typically 30 mTorr. Alternatively, halocarbon gases such as hydrogen chloride (HCl) vapor may be used, typically at a pressure of 5 Torr. Laser source 36 is typically operated at a wavelength between 550 and 190 nm. A preferred choice for laser source 36 is a pulsed KrF laser. The laser fluence level is chosen according to the particular layer being etched. Typically, with a KrF laser and aluminum mask, this laser fluence will be between 0.03 and 5 Joules/cm$^2$. The choice of ambient will affect the optimum fluence level, as appreciated by those of ordinary skill in the art. For example, an energy density of 2 Joules/cm$^2$ has been found to be acceptable in a reduced air pressure ambient of 30 mTorr. Fixture 94 is a motorized x-y stage. The surface of wafer 26 is fully exposed by translating the wafer using the support and motorized stage 43.

The KrF laser will typically remove a depth of about 0.1 to 0.3 micrometers per pulse. KrF lasers are usually capable of producing about 100 to 200 pulses per second. A typical exposure is 0.05 to 0.3 seconds for each portion of the substrate 26.

Figure 8A:
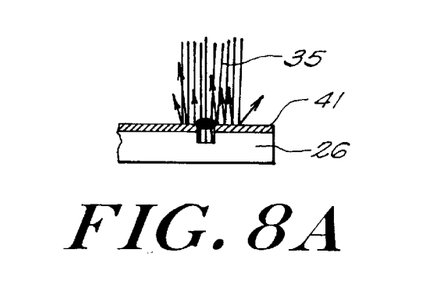
FIG. 8A illustrates a laser etching technique according to the present invention employing a contact mask.
Figure 8B:
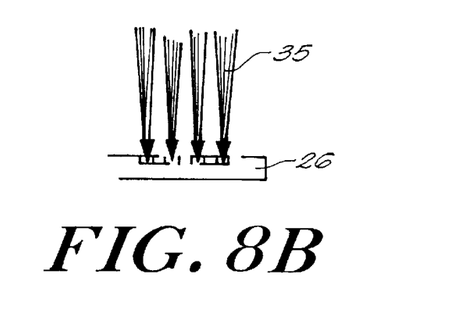
FIG. 8B illustrates a laser etching technique according to the present invention employing a projection mask.
Figure 8C:
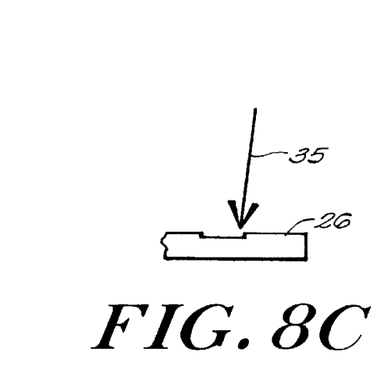
FIG. 8C illustrates a laser etching technique in which a pattern is directly written onto the substrate by a scanning laser.

FIGS. 8A–8C illustrate details on various means for selectively illuminating the wafer. In FIG. 8A a contact mask 41 is used in which an unpatterned beam 35 is incident on a thin film mask in contact or proximity to the substrate 26. In FIG. 8B an image-carrying laser beam 35 is used to induce etching on the substrate 26, with no contact mask. Finally, in FIG. 8C a finely focused laser beam 35 is scanned across the substrate 41, also in the use of a projection mask to selectively illuminate and hence selectively etch the wafer 26.

The projection technique illustrated in FIG. 8B works particularly well with a XeCl laser source 36 operating at a 308 nm wavelength in combination with a transmission style photo mask 42. Photo mask 42 (as illustrated in FIG. 7) can be a 1 micrometer thick aluminum film patterned on a fused silica substrate. This photo mask is also useful with other laser sources 36, for example, a frequency doubled Nd:YLF laser operating at a wavelength of 525 nm. A demagnification ratio of about 10 works well, and increases the density of laser light 35 at substrate 26 approximately 100 fold over the laser light intensity at photo mask 42. Note that the pattern on mask 42 is a negative of the pattern desired to be etched, as incident laser light 25 induces etching at substrate 26.

Note that the halogen ambient used should not significantly absorb laser light at the frequency of radiation. Chlorine gas at a pressure of 600 Torr is a good chemical ambient for projection geometry where laser source 36 (as shows in FIG. 7) is the 525 nm frequency doubled Nd:YLF laser, as chlorine is highly transparent at this wavelength. Laser fluences are typically in the range of 0.3–10 Joules per square cm at the substrate 41. Step and repeat techniques are typically used in order to expose the whole wafer 26 to the laser radiation 35.

If laser source 36 is an XeCl laser, HCl vapor at about 10–400 Torr pressure is an excellent ambient. HCl can be superior to other alternative ambients, such as straight chlorine, when using an Ultraviolet laser because there is significant laser light attenuation in straight chlorine vapor at these wavelengths. An alternative ambient is simply reduced air pressure, preferably below about 1 Torr.

Note that photo mask 42 may also be a patterned dielectric multilayer mirror or metal film. The reflectivity of dielectric multilayers can exceed 99.9% and hence the laser energy absorbed by such a dielectric mirror can be less than 0.1%. As a result, higher laser power is possible without risking mask damage is possible with a dielectric multilayer mask.

FIG. 8C illustrates the use of a scanned focused laser beam to selectively illuminate and hence selectively etch multilayer substrate 26. Use of a scanned laser beam eliminates the need for photo mask 42 or contact mask 41. Beam optics 38 (as show in FIG. 7) focuses the laser on the substrate to a spot with micrometer or submicrometer dimensions.

Scanner 39 scans the spot over the substrate to selectively etch the substrate. Suitable scanners 39 are galvanometer scanning mirrors or electro-optic deflectors. A preferred embodiment of the apparatus illustrated in FIG. 8C uses a CW Argon ion laser operating at a wavelength of 550 nm, 488 nm or 351 nm. Fixture 43 can be a motorized translation stage, and the substrate 26 can be selectively illuminated by translating the substrate using the translation stage 43. An excellent translation stage 43 is a crossed roller bearing X-Y stage with linear motor drives and glass scale encoders. For translation in the Z direction, that is perpendicular to a plane defined by the X-Y stage, a similar cross roller bearing stage with a rotary DC motor and a glass scale encoder can be used. Optimally, the three axis X, Y, and Z system is closed loop servo controlled, as is known in the art.

The ambients described above for use with the apparatus illustrated in FIGS. 7 and 8A–8C are also useful with the Argon ion laser as laser source 36 in FIG. 7. Note, however, that pure chlorine absorbs light at the 351 nm Argon line and should be used at a reduced pressure, preferably below 10 Torr, to avoid excess extinction of the laser beam. The other ambients, such as HCl, can be used at pressures up to several hundred Torr. Acceptable laser fluences range from 100 mw up to several watts, depending on the optical and thermal properties of the substrate.

Note also that other gases such as hydrogen fluoride or hydrogen bromide also provide an acceptable halogen ambient.

For metals in the class iron, nickel and cobalt, a special chlorine-based laser passivation process has been developed. Laser heating these later metals in the presence of chlorine serves to react them to various metal chlorides, for example $FeCl_3$ and $CoCl_3$. These chloride products are unlike the product of laser etching of titanium ($lTiCl_4$) and the product of laser etching aluminum ($AlCl_4$), in that they self-passivate as non-volatile water soluble residues. The non-explosive laser etching of permalloy materials for magnetic devices is, then, accomplished in a two-step process. The first step is to laser-heat the metal film in the presence of chlorine; this is followed by a second step of a liquid rinse or other clean-up step to remove the non-volatile residues.

Excellent results were obtained laser etching of seven-micrometer thick plated films of iron/nickel/cobalt alloy (permalloy) on alumina substrates using the following procedure. The substrates were put into a windowed cell, which was evacuated to a pressure of 25 milliTorr then backfilled with 200 Torr of chlorine vapor. A continuous-wave argon ion laser beam operating simultaneously at 488.0-nm and 514.5-nm wavelengths was focused with a 20× microscope objective (Mitutoyo Corp.) to a spot size of approximately 1.2 micrometer diameter. The laser power was adjusted to 0.3–0.5 Watts incident on the permalloy film, and scanned with galvanometer mirrors (General Scanning Corp.) at a rate of 20 mm/s across the metal film. Repeated scans were used to precisely remove the permalloy with a highly controlled laser-induced reaction which forms iron and cobalt chlorides. Typically 100 to 150 overtraces at the 20 mm/s scan velocity were used to completely remove the 7-micrometer thickness. The reaction forms light particulate residues which are swept in front of the laser beam as the film is thinned. An excellent edge definition is obtained. Following this first step, the substrate was removed from the cell and rinsed with de-ionized water. Those knowledgeable in the art will know how to obtain comparable results with various chlorine-containing, fluorine-containing and bromine-containing gases.

Laser microchemical etching involving pyrolytic processes can be highly nonlinear. Such nonlinearity leads to the explosive cratering of the material when one layer of material is adjacent another layer of material and the two materials have drastically different reactivities for a given set of process parameters. As discussed previously, this is a particular problem when using the laser technique to etch a reactive self-passivating metal such as aluminum or titanium, or a ceramic layer adjacent a metal layer.

The present invention employs suppressant gasses introduced into the ambient to control these explosive reactions and allow the high resolution and efficient laser micro chemical etching of reactive self-passivating metals and of ceramic layers adjacent a metal layer.

Suitable suppressant gasses include oxygen vapor, nitrogen vapor and water vapor. The use of the suppressant gasses allows higher laser powers and permits the use of continuous wave laser radiation, as well as pulsed laser radiation, and also allows higher pressures of halogen gasses in the ambient, thereby significantly increasing laser etch rates. Complicated structures may be etched with high resolution. The method is also particularly suitable for micromachining three-dimensional structures into thick aluminum/titanium films or aluminum/titanium plates.

Vapor suppressants can be used with the apparatus disclosed in FIGS. 7 and 8A–8C. That is, they may be used where the substrate is selectively illuminated through the use of a contact mask 41, a projection mask 42 or a scanned laser beam 35. For the etching of the typical materials found in a data transfer head, suitable lasers for use with suppressant gasses include a frequency doubled Nd:YLF laser operating at a wavelength of 525 nm and a CW Argon ion laser operating at a wavelength of 488 nm. The Nd:YLF laser is optimally operated in a Q-switched mode at a repetition rate of 0.1–50 KHz and with a pulse length of 7–30 ns. Typical pulse energies range from 30 milliJoules/$cm^2$ to 5 Joules/$cm^2$ at the substrate. With the CW Argon ion laser, a CW power of approximately 0.05 to 3 watts of laser light is typically focused onto the substrate. The exact power level optimally focused onto the substrate depends on the reflectivity and thermal conductivity of the substrate, and on the thickness of the layer being etched, as is understood by those of ordinary skill in the art.

Reservoirs 30 and 31 in FIG. 7 typically contain a halogen gas and suppressant gas, respectively. For the laser microchemically etching of aluminum, the halogen gas can be HCl and the suppressant gas can be oxygen. Good ambient conditions for aluminum etching are a mixture of 100 Torr HCl and 20 to 100 Torr of oxygen. Alternative conditions yielding slower but more easily controlled etching are 10 Torr of HCl and 200 Torr of oxygen. Note that if laser radiation source 36 is a CW source, the laser power density should be such that the temperature at the metal does not exceed the metal melting point. If a pulsed laser is used, it is permissible to briefly exceed the metal melting point. In either case, greater control of the etching process is obtained, if the aluminum does not melt. For a continuous wave laser, avoiding melting generally requires a power per unit rate beam radius of less than about 10 Kw/cm; pulsed laser energy density in the focused laser beam is generally kept below about 3 Joules/$cm^2$.

As a more specific example, the procedure for etching an aluminum film deposited onto an alumina substrate is discussed. The substrate 26 is placed into chamber 27 and secured by fixture 43. The chamber is evacuated with vacuum pump 29 to a pressure of 10–4 Torr. Vacuum pump 29 is preferably a turbomolecular pump. Chamber 27 is then backfilled from reservoirs 30 and 31 with 100 Torr HCl and 20 Torr oxygen. Laser source 36 is preferably a frequency-quadrupled Q-switched Nd:YAG laser operating at a wavelength of 265 nm. Laser radiation beam 35 is focused to a spot size of 1.2 microns and an energy density of 400–800 mili Joules/$cm^2$. Alternative ambient conditions yielding a slower but more easily controlled etching process are 10 Torr of HCl and 200 Torr of oxygen. The substrate is selectively illuminated, and hence selectively etched, by scanning the laser beam as in FIG. 8C.

For laser microchemical etching of sputter deposited aluminum films on an aluminum nitrate substrate, nitrogen may be used as the suppressant gas. Laser source 36 may be an Argon ion laser operating at a wavelength of 488 nm. The power per unit spot diameter of the laser beam is optimally 0.5 to 10 kW/cm, the actual value depending on the optical properties of the sputter deposited aluminum. 600 Torr of nitrogen and 10 Torr of chlorine vapor provide a suitable ambient. Note that other self-reacting passivating metals such as titanium may be etched under similar process parameters. A proper ambient of the etching of titanium is 50 Torr of chlorine diluted with 400 Torr of nitrogen.

The suppressant gases are believed to allow high resolution laser etching of metals by reacting with the exposed metal to form a stable oxide in competition with halogen gases. The oxide is formed at rate such as to quench the more explosive halogen.

A particular problem in magnetic head manufacture is the etching of iron/cobalt and iron/nickel alloys (typical magnetically active materials). A common problem is to etch these alloys as deposited or plated films on alumina or other ceramic substrates. A laser-reactive procedure was developed for these materials in accord with the invention.

Additional detail on apparatus useful for laser etching or substrates can be found in "Laser Microchemistry for Use in Solid State Electronics," D. J. Ehrlich et al. IEEE J. Quantum Electronics, QE-16, p. 1233, 1980, herein incorporated by reference.

The invention is thus disclosed by a reference to a particular set of processing steps and by description of a particular apparatus. Variations and modifications within the spirit and scope of the invention will occur to those skilled in the art and all such variations and modifications are intended to be covered by the claims appended hereto.

Having described the invention, what is claimed is:

1. A method of etching a multilayer structure in a laser-induced, reactive halogen etching ambient, the method comprising:
    disposing a multilayer structure, comprising at least a ceramic layer and a metallic layer deposited upon the ceramic layer, said ceramic and metal layers formed of materials having different etching characteristics, in a controlled environment chamber,
    introducing a reactive halogen-containing gas into the chamber;
    introducing a suppressant gas into the chamber, the suppressant gas chosen for its ability to reduce the difference in etch rates of the ceramic and metallic layers when the multilayer structure is exposed to the reactive halogen-containing gas;
    selecting a wavelength of laser radiation within the range from about 550 nm to about 190 nm to further reduce the difference in etch rates of the ceramic and metallic layers during laser induced halogen etching; and
    irradiating selected portions of the multilayer structure with the selected wavelength of laser radiation to induce reactive halogen etching of at least a portion of the ceramic and metallic layers.

2. The method of claim 1 wherein the step of disposing the multilayer structure in a controlled environment chamber further comprises maintaining the pressure in the chamber at a pressure below atmospheric pressure.

3. The method of claim 1 wherein the step of introducing a reactive halogen-containing gas into the chamber further comprises introducing HCl vapor into the chamber as the reactive halogen-containing gas.

4. The method of claim 1 wherein the step of introducing a reactive halogen-containing gas into the chamber further comprises introducing chloride as the reactive halogen-containing gas.

5. The method of claim 1 wherein the step of introducing a suppressant gas into the chamber further comprises introducing oxygen as a suppressant gas into the chamber.

6. The method of claim 1 wherein the step of introducing a suppressant gas into the chamber further comprises introducing water vapor as a suppressant gas into the chamber.

7. The method of claim 1 wherein the step of introducing a suppressant gas into the chamber further comprises introducing nitrogen as a suppressant gas into the chamber.

8. A method of etching multilayer structure in laser-induced, reactive halogen etching ambient, the method comprising:
    disposing a multilayer structure, comprising at least a ceramic layer and metallic layer of materials having different etching characteristics, in a controlled environment chamber, said multilayer structure comprising at least a ceramic layer and a metallic layer, the metallic layer further comprising at least one material selected from the group consisting of iron, cobalt, nickel, and alloys thereof;
    introducing a reactive halogen-containing gas into the chamber;
    introducing a suppressant gas into the chamber, the suppressant gas chosen for its ability to reduce the difference in etch rates of the ceramic and metallic layers when the multilayer structure is exposed to the reactive halogen-containing gas;
    selecting a wavelength of laser radiation within the range from about 550 nm to about 190 nm to further reduce the difference in etch rates of the ceramic and metallic layers during laser induced halogen etching; and
    irradiating selected portions of the multilayer structure with the selected wavelength of laser radiation to induce reactive halogen etching of at least a portion of the ceramic and metallic layers.

* * * * *